(12) United States Patent
Lee et al.

(10) Patent No.: US 6,818,139 B1
(45) Date of Patent: Nov. 16, 2004

(54) METHOD FOR FORMING A MICRO-PATTERN ON A SUBSTRATE

(75) Inventors: Hong Hie Lee, Seoul (KR); Dahl Young Khang, Siheung (KR)

(73) Assignee: Minuta Technology Co., Ltd. (KR)

( * ) Notice: Subject to any disclaimer, the term of this patent is extended or adjusted under 35 U.S.C. 154(b) by 0 days.

(21) Appl. No.: 09/959,057

(22) PCT Filed: Apr. 20, 2000

(86) PCT No.: PCT/KR00/00371

§ 371 (c)(1),
(2), (4) Date: Oct. 15, 2001

(87) PCT Pub. No.: WO00/65408

PCT Pub. Date: Nov. 2, 2000

(30) Foreign Application Priority Data

Apr. 21, 1999 (KR) .......................... 1999/14168
Oct. 22, 1999 (KR) .......................... 1999/46063

(51) Int. Cl.[7] ................................. B44C 1/22
(52) U.S. Cl. .................. 216/49; 216/52; 216/53; 216/67; 216/95; 264/53; 264/87; 264/134; 264/220; 264/227; 264/232; 264/313
(58) Field of Search ............... 264/413, 53, 87, 264/134, 220, 227, 232, 313; 205/660, 666; 216/44, 49, 67

(56) References Cited

U.S. PATENT DOCUMENTS

| 5,817,242 | A | * | 10/1998 | Biebuyck et al. | ............. 216/41 |
| 5,900,160 | A | * | 5/1999 | Whitesides et al. | ........... 216/41 |
| 6,284,345 | B1 | * | 9/2001 | Ruoff | .......................... 428/143 |
| 6,355,198 | B1 | * | 3/2002 | Kim et al. | .................. 264/259 |
| 6,518,189 | B1 | * | 2/2003 | Chou | .......................... 438/706 |
| 2001/0036602 | A1 | * | 11/2001 | McGrew et al. | ............. 430/321 |

FOREIGN PATENT DOCUMENTS

JP      10232306 A * 9/1998 ............ G02B/5/18

* cited by examiner

*Primary Examiner*—Allan Olsen
(74) *Attorney, Agent, or Firm*—Anderson Kill & Olick, PC

(57) ABSTRACT

In a method for forming a micro-pattern on a substrate (200), polymer material having a solvent is coated on the substrate, thereby forming a polymer film on the substrate. Then, a mold (204) having a predetermined shape is compressed into the polymer film (202) on the substrate by employing a predetermined compression technique to entail a plastic deformation of the polymer film, thereby patterning the polymer film. This compression procedure is performed at a room temperature, e.g., of about 10 to about 30° C. In the present invention, before the mold (204) is pressed into the polymer film (202), a free volume in the polymer film is previously increased so that a pressure applied on the polymer material needed to plastically deform the polymer film is reduced. Thereafter, etching is performed on the substrate through the use of the patterned polymer film as an etching mask, thereby forming a micro-pattern on the substrate.

22 Claims, 6 Drawing Sheets

METHOD FOR FORMING A MICRO-PATTERN ON A SUBSTRATE

TECHNICAL FIELD OF THE INVENTION

The present invention relates to a method for forming a micro-pattern on a substrate; and more, particularly, to a method for forming a micro-pattern on a substrate by employing a compression patterning technique.

BACKGROUND ART

One of conventional micro-pattern forming methods is a photolithography technique. In a conventional photolithography technique, since the width limit in a micro-pattern is determined by the wavelength of a light irradiated on a mask for the micro-pattern, it is difficult to fabricate a sub-100 nm structure.

Further, in a conventional process employing the photolithography technique, a process forming a pattern involves multiple steps, e.g., pattern formation, etching and cleaning step and these steps are costly and time-consuming. When the surface of a substrate on which a pattern is formed is not flat, there occurs the diffraction and/or reflection of the light, thereby rendering the process difficult to control.

To ameliorate the problem described above, there is developed a method for forming a sub-100 nm micro-pattern. An imprint process that presses a mold into a thermoplastic film on a substrate has been developed to create micro-patterns for use in various fields, e.g., integrated circuit fabrication process, photo-electric, magnetic element manufacturing process or the like. For example, a micro-pattern forming method suggested by Stephen Y. Chou et al. is described in Appl. Phys. Lett., 67(21), 20 Nov. 1995.

In this method, a mold is first pressed into a thin thermoplastic polymer film, e.g., made of polymethylmethacrylate (PMMA), on a substrate, e.g., made of silicon, the substrate being heated at a high temperature, e.g., 150 to 200° C., higher than its glass transition temperature, e.g., 104° C. for PMMA. Above that temperature, the polymer behaves as a viscous liquid and can flow under a pressure, thereby conforming to the mold. Then the mold is compressed against a sample and held until the temperature drops below the glass temperature. At a pressure, e.g., ranging from 100 to 150 atmospheres, the pattern on the mold can be fully transferred into the polymer film, e.g., the PMMA.

Since, however, a pressing procedure of this method is performed at a high temperature, this method cannot be performed repeatedly or repetitively. In detail, to form another pattern at another position on a substrate after forming one pattern at a certain position on the substrate, it is necessary to heat the substrate having the polymer film formed thereon again above the glass transition temperature.

But, when the substrate is heated again at the high temperature as described above, the previously formed pattern of the polymer film will disappear. Accordingly, employing the process repetitively is impossible. It should be noted that another position mention above may represent either a neighboring position of a previously patterned position or a position on top surface of the previously patterned polymer film.

To avoid this problem by performing a pressing procedure as one step, a mold should be made to have a more complex pattern, e.g., a coarse pattern coupled with a fine pattern. But in this case, there is entailed a cost problem together with a technical burden to make such a complex mold.

FIG. 5 presents a diagram showing a patterned polymer film 501 formed on a substrate 500 by using a conventional pattern forming method. When the pressing procedure is performed at a room temperature under a high pressure felt by a patterned polymer, e.g., of about 50 to 150 atmospheres, there usually occurs an undesired portion in a patterned polymer film. For example, as presented in FIG. 5, an undesired protruded portion 502 near top edges of the patterned polymer film 501 may occur due to an undesired plastic deformation thereat.

In a conventional pressing procedure, when a load is applied on a polymer film on a substrate at a room temperature, if the pressure is below a certain level, a free volume in the polymer film absorbs the pressure applied thereon by decreasing its volume. But, if the pressure is greater than a certain value, there may be resulted in a plastically deformed undesirable portion in the polymer film. It should be noted that the free volume represents total volume of voids or empty spaces in the polymer film.

In view of the foregoing, the conventional micro-pattern forming methods described above cannot form a micro-pattern having a desired pattern by performing a pressing procedure at a room temperature.

DISCLOSURE OF THE INVENTION

It is, therefore, a primary object of the present invention to provide a method for forming a micro-pattern on a substrate by employing a compression patterning technique at a room temperature.

In accordance with one aspect of the present invention, there is provided a micro-pattern on a substrate, the method comprising the steps of: (a) coating polymer material having a solvent on the substrate, thereby forming a polymer film on the substrate; (b) pressing a mold having a predetermined shape into the polymer film on the substrate by employing a predetermined compression technique to entail a plastic deformation of the polymer film, thereby patterning the polymer film; and (c) performing etching on the substrate through the use of the patterned polymer film as an etching mask, thereby forming a micro-pattern on the substrate.

In accordance with another aspect of the present invention, there is provided a forming a micro-pattern on a substrate, the method comprising the steps of: (a) coating polymer material having a solvent on the substrate, thereby forming a polymer film on the substrate; (b) pressing a first mold having a first predetermined shape into the polymer film on the substrate to form a first patterned polymer film and then pressing a second mold having a second predetermined shape into the first patterned polymer film by employing a predetermined compression technique, thereby providing a patterned polymer film; and (c) performing etching on the substrate through the use of the patterned polymer film as an etching mask, thereby forming a micro-pattern on the substrate.

BRIEF DESCRIPTION OF THE DRAWINGS

The above and other objects and features of the present invention will become apparent from the following description of preferred embodiments given with reference to the accompanying drawings, in which.

MODES OF CARRYING OUT THE INVENTION

Figure 1:
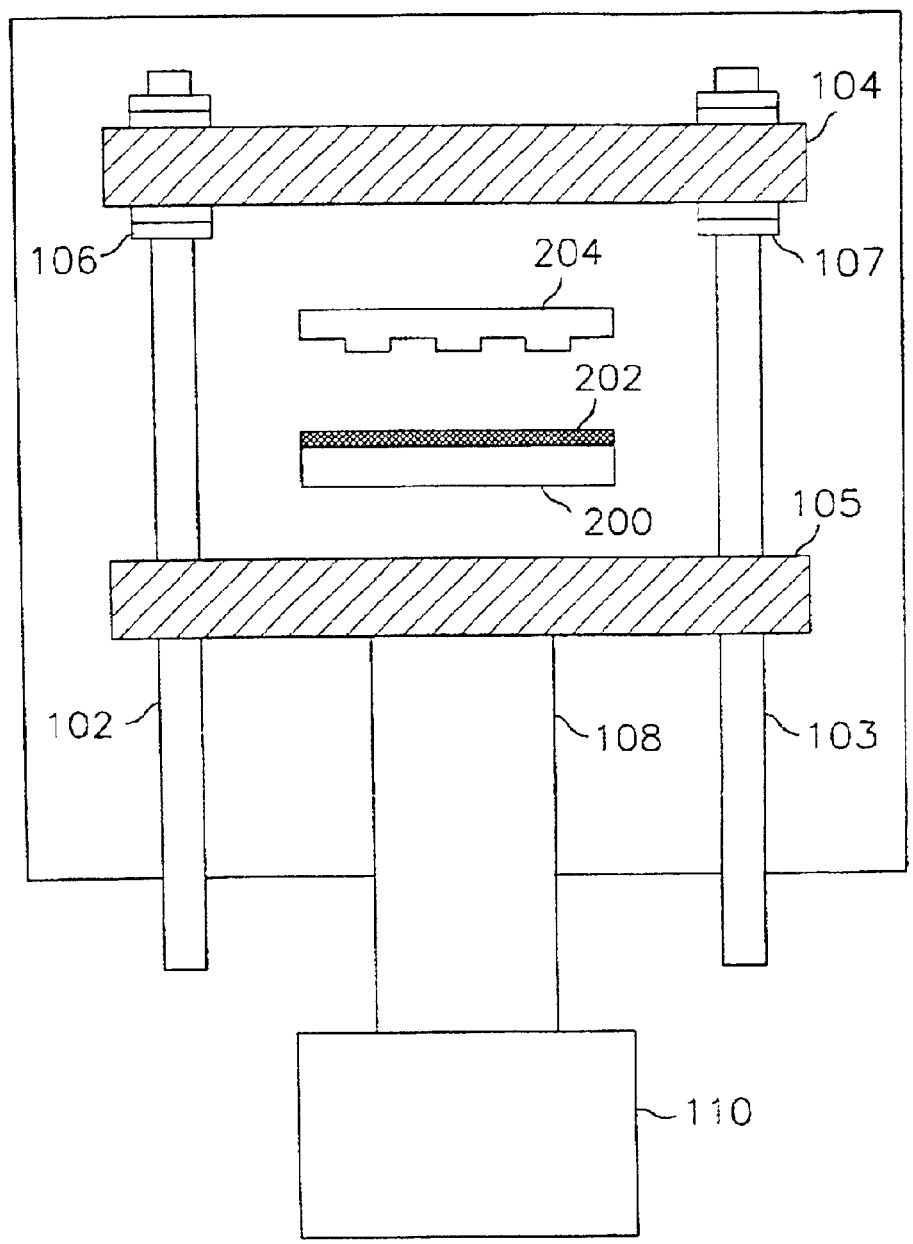
FIG. 1 shows a micro-pattern forming apparatus 100 for use in forming a micro-pattern on a substrate in accordance with a preferred embodiment of the present invention.

Referring to FIG. 1, there is shown a micro-pattern forming apparatus 100 for use in forming a micro-pattern on a substrate in accordance with a preferred embodiment of the present invention. The apparatus 100 is provided with two fixed shafts 102 and 103, an upper and a lower press plate 104 and 105, a pressure transmitting shaft 108 and a pressing unit 110. The upper press plate 104 is installed on top of the fixed shafts 102 and 103 through bolts 106 and 107, respectively, as shown in FIG. 1. The lower press plate 105 is installed on one end of the pressure transmitting shaft 108 so that the plate 105 is slidably connected to the shafts 102 and 103. The pressing unit 110 is installed at the other end of the shaft 108 to vertically move the shaft 108.

In the micro-pattern forming apparatus 100, a mold 204 of a predetermined shape and a substrate 200, both facing each other, are placed between the upper press plate 104 and the lower press plate 105, wherein a polymer film 202 is coated on the substrate 200. It should be noted that a patterned side of the mold 204 faces with the polymer film 202 on the substrate 200 as shown in FIG. 1.

In the apparatus 100, when the shaft 108 elevates the lower press plate 105 toward the upper press plate 104 by the pressure transmitted thereto from the pressing unit 110, the mold 204 is pressed into the polymer film to thereby pattern the polymer film 202 thereafter.

From now on, referring to FIGS. 2A to 2D, FIGS. 3A to 3B and FIGS. 4A to 43, there will be described methods for forming a micro-structure on substrates in accordance with preferred embodiments of the present invention.

Figure 2A:
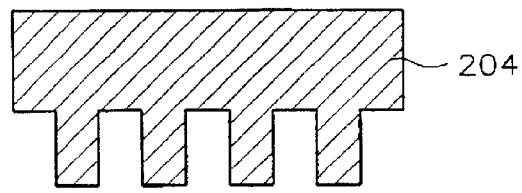
FIGS. 2A to 2D represent diagrams showing a micro-pattern forming process in accordance with a preferred embodiment of the present invention.
Figure 2A:
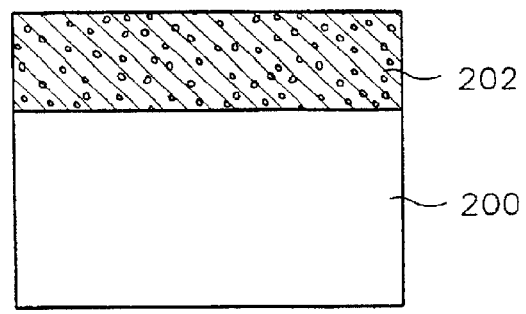

FIGS. 2A to 2D show diagrams representing a micro-pattern forming process in accordance with a preferred embodiment of the present invention. FIG. 2A shows a mold 204 and a substrate 200 on which a polymer film 202 is coated. In a method for forming a micro-pattern on a substrate in accordance with a preferred embodiment of the present invention, the mold 204 having a predetermined shape is first prepared. For example, one side, e.g., a lower side thereof as shown in FIG. 2A is previously patterned in a predetermined shape. The substrate 200 can be made of a silicon or silicon dioxide.

Polymer material is coated on the substrate 200 by employing a predetermined coating technique, e.g., a spin coating technique to thereby form the polymer film 202. The polymer material is typically made of polystyrene, polymethylmethacrylate (PMMA), etc., but not limited to this. A solvent, e.g., toluene or trichloroethylene (TCE) is usually added in the polymer material so as to obtain the fluidity thereof.

A free volume in the polymer film 202 may be increased so that a pressure applied on the polymer material needed to plastically deform the polymer film is reduced. From now on, various methods for increasing a free volume in the polymer film will be described.

In accordance with a preferred embodiment of the present invention, after forming a porous structure, e.g., voids, in the polymer film 202 by using a known porous structure forming technique to increase a free volume thereof, the polymer film 202 having the porous structure may be coated on the substrate 200.

In accordance with another preferred embodiment of the present invention, after the substrate 200 having the polymer film 202 coated thereon, the polymer film 202 having a solvent therein, the substrate 200 is dried by employing either a vacuum drying technique or an open ambient drying technique, thereby increasing the free volume thereof.

Figure 4A:
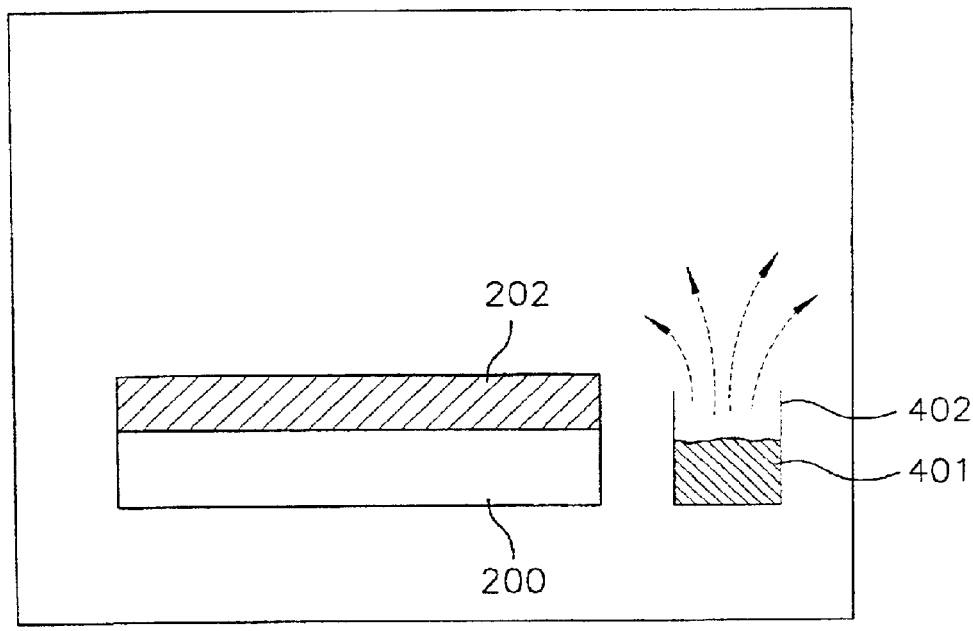
FIGS. 4A and 4B depict diagrams for use in describing a method for forming a free volume in a polymer film on a substrate.
Figure 4B:
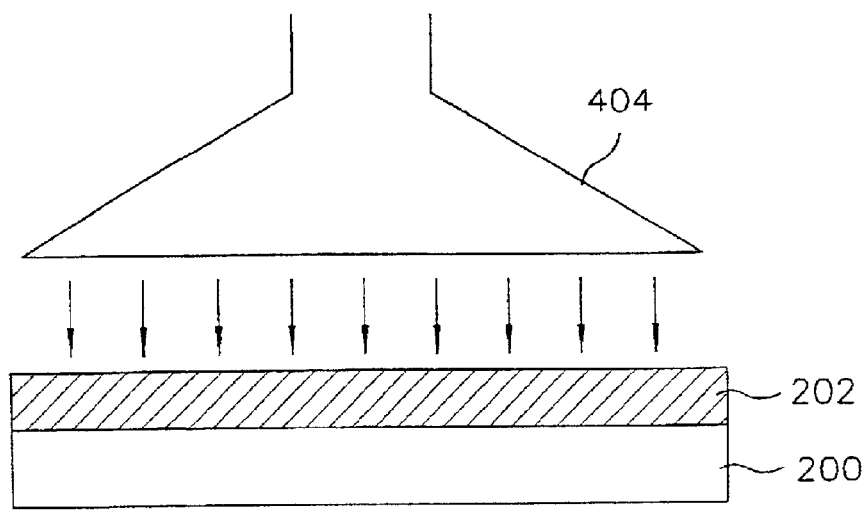
Figure 5:
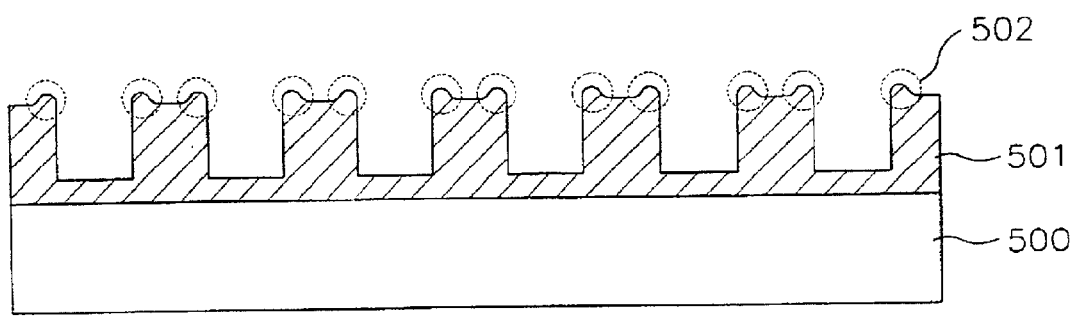
FIG. 5 presents a diagram showing a patterned polymer film formed on a substrate by using a conventional pattern forming method.

FIGS. 4A and 4B depict diagrams for use in describing a method for forming a free volume in a polymer film on a substrate in accordance with a preferred embodiment of the present invention. In accordance with yet another preferred embodiment of the present invention, the substrate 200 having the polymer film 202 coated thereon is mounted in a reactor 400 provided with a vessel 402 having a solvent 401 therein as shown in FIG. 4A. Thereafter, the vessel 402 is heated at a predetermined temperature range to render the solvent 401 in the vessel to evaporate, thereby making an evaporated solvent penetrating into the polymer film 202; and then the substrate 200 having the polymer film 202 coated thereon is dried by employing either a vacuum drying technique or an open ambient drying technique, thereby increasing the free volume thereof.

In accordance with another preferred embodiment of the present invention, before pressing a mold, a substrate having a polymer film is mounted in the reactor 400 provided with the vessel 402 having the solvent 401 therein. Then, the vessel 402 is heated at a predetermined temperature range to render the solvent in the vessel to evaporate, thereby making an evaporated solvent penetrate into the polymer film and accordingly leaving the penetrated solvent in the polymer film. Namely, under the condition, e.g., referred to as a wet-state, that the solvent is left therein, the polymer film 202 may be pressed.

In accordance with still yet another preferred embodiment of the present invention, as shown in FIG. 4B, a solvent is directly sprayed on the substrate 200 having the polymer film 202 coated thereon by employing a spraying unit 404. Thereafter, the substrate 200 having the polymer film 202 coated thereon is dried by employing either a vacuum drying technique or an open ambient drying technique, thereby increasing the free volume thereof.

Figure 2B:
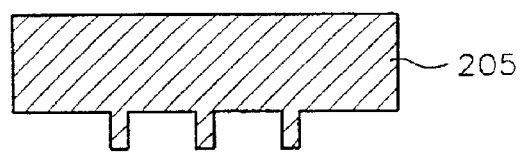
Figure 2B:
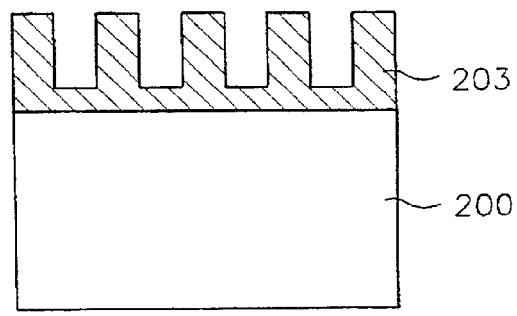

After forming the polymer film 202 having the free volume by employing one of the techniques described above, the mold 204 as shown in FIG. 2A is pressed into the polymer film 202 on the substrate 200 by using a compressing apparatus, e.g., the micro-pattern forming apparatus 100, to entail a plastic deformation of the polymer film, thereby patterning the polymer film, e.g., as a first patterned polymer film. Referring to FIG. 2B, there is illustrated a first patterned polymer film 203 on the substrate 200.

Typically, this compression step is performed below the glass transition temperature of the solvent, typically at a room temperature, e.g., 10° C. to 30° C. In this case, the external load applied thereon is typically 1 atm; but the pressure felt by the polymer material depends on its area, e.g., the pressure exerted thereon ranging from 20 to 30 atm.

Figure 2C:
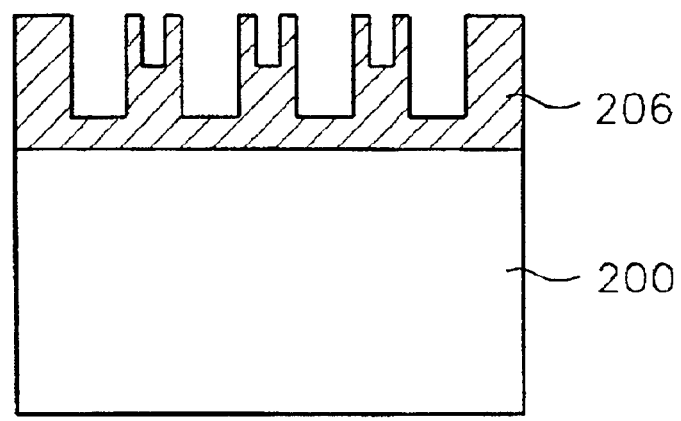

In accordance with a preferred embodiment of the present invention, another mold 205 having a preset shape, e.g., finer than that of the mold 204 as shown in FIG. 2B, may be further prepared and then pressed into the first patterned polymer film 203 to thereby form a second patterned polymer film 206 on the substrate 200 as a patterned polymer film as shown in FIG. 2C.

Namely, in a pressing step of a micro-pattern forming method in accordance with a preferred embodiment of the present invention, N number of molds having corresponding predetermined shapes may be pressed into a polymer film on a substrate sequentially by employing a predetermined compression technique to entail a plastic deformation of the polymer film, thereby patterning the polymer film, wherein N is a predetermined positive integer, typically 2.

In this case, when the different molds are used, a mold having a higher aspect ratio is usually pressed earlier than a mold having a lower aspect ratio; and a mold having a coarser pattern is usually pressed earlier than a mold having a finer pattern.

In accordance with the present invention, since the polymer film 202 has a free volume therein, two patterns of molds 204 and 205 can be transferred onto the polymer film 200 in sequence at a room temperature, e.g., 10 to 30° C. It should be noted that with the aid of an increased free volume in the polymer film 202, a pressure applied on the polymer material needed therein to plastically deform the polymer film is reduced.

Figure 2D:
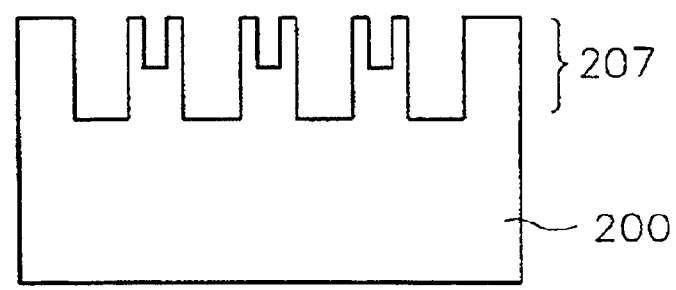

After obtaining a desirably patterned polymer film, e.g., the second patterned polymer film 206 on the substrate 200 as shown in FIG. 2C, etching is performed through the use of the desirably patterned polymer film as an etching mask, thereby forming a micro-pattern, e.g., a pattern 207, on the substrate 200 as shown in FIG. 2D. FIG. 2D shows the pattern 207 in the substrate 200 obtained by employing a physical etching technique, e.g., a reactive ion etching (RIE). But, the etching may be a chemical etching.

Figure 3A:
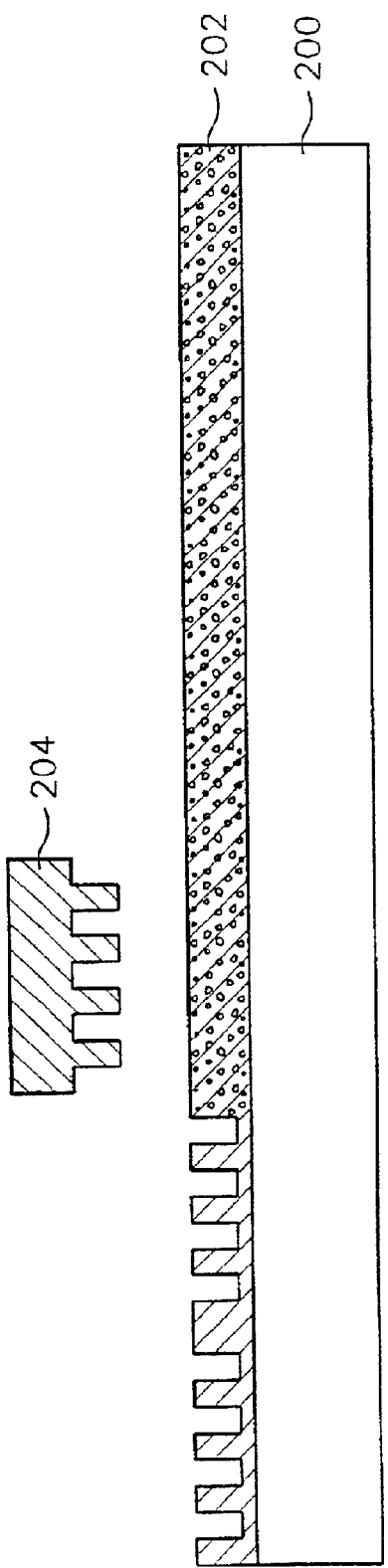
FIGS. 3A and 3B illustrate diagrams representing a micro-pattern forming process in accordance with another preferred embodiment of the present invention.
Figure 3B:
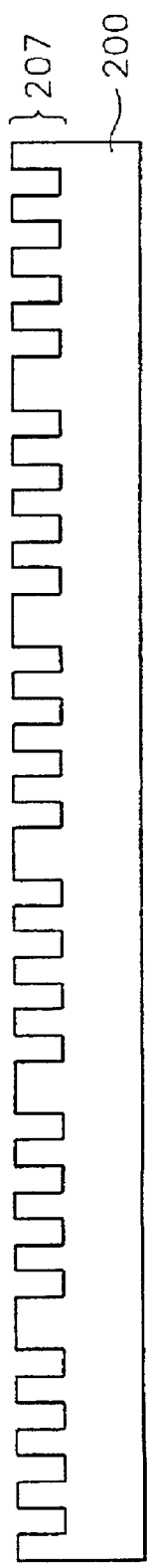

Meanwhile, referring to FIGS. 3A and 3B, there are illustrated diagrams representing a micro-pattern forming process in accordance with another preferred embodiment of the present invention. In this embodiment, a length of a substrate 200 is larger than that of the mold 204, wherein a polymer film 202 having a free volume is coated on the substrate 200. The micro-pattern process of this embodiment is basically the same as that of the embodiment described above with reference to FIGS. 2A to 2D and FIGS. 4A to 4B except that the mold 204 is repeatedly pressed into a polymer film on a substrate.

For example, a mold 204 as shown in FIG. 3A, having a predetermined shape is repeatedly pressed into a polymer film 202 on a substrate 200 to entail a plastic deformation of the polymer film, thereby patterning the polymer film 202, wherein the length of the substrate 200 is greater than that of the mold 204. In this case, at each time, the mold 204 is pressed into different position thereof such that the whole surface of the polymer film 202 is patterned. This technique is known in the art as the so-called step-and-repeat technique in lithography.

For example, the mold 204 is pressed into the polymer film 202 starting from left edge of the polymer film 202 as shown in FIG. 3A, in sequence at a room temperature. As a result, the polymer film 202 is fully patterned. This repeated pressing, i.e., a patterning procedure, may be done either with the same mold or with different molds. It should be noted that those who skilled in the art can easily prepare and utilize a unit to move the mold 24 horizontally.

After forming a desirably patterned polymer film, etching is performed through the use of the desirably patterned polymer film as an etching mask, thereby forming a micro-pattern, e.g., a pattern 207 on the substrate 200 as shown in FIG. 3B.

While the present invention has been described with respect to certain preferred embodiments only, other modifications and variations may be made without departing from the scope and spirit of the present invention as set forth in the following claims.

What is claimed is:

1. A method for forming a micro-pattern on a substrate, the method comprising the steps of:
   (a) coating polymer material having a solvent on the substrate, thereby forming a polymer film on the substrate;
   (b) pressing a mold having a predetermined shape into the polymer film on the substrate by employing a predetermined compression technique to entail a plastic deformation of the polymer film, thereby patterning the polymer film; and
   (c) performing etching on the substrate through the use of the patterned polymer film as an etching mask, thereby forming a micro-pattern on the substrate,
   wherein the method further comprises the step of:
   (b1) before said step (b), increasing a free volume in the polymer film so that a pressure applied on the polymer material needed to plastically deform the polymer film is reduced.

2. The method according to claim 1, wherein in said step (c), said etching is either a plasma ion etching or a chemical etching.

3. The method according to claim 1, wherein said step (b1) includes the steps of:
   (b11) mounting the substrate having the polymer film in a reactor provided with a vessel having a solvent therein;
   (b12) heating the vessel at a predetermined temperature range to render the solvent in the vessel to evaporate, thereby making an evaporated solvent penetrate into the polymer film; and
   (b13) performing either a vacuum drying or a drying in open ambient on the polymer film, thereby increasing the free volume in the polymer film.

4. The method according to claim 1, wherein in said step (b1), the free volume is increased by performing either a vacuum drying or a drying in open ambient on the polymer film after directly spraying the solvent on the polymer film.

5. The method according to claim 1, wherein said step (b) is performed at a temperature below the glass transition temperature of the polymer material.

6. The method according to claim 5, wherein said step (b) is performed at a temperature range of about 10 to about 30° C.

7. The method according to claim 1, wherein the solvent is a trichloroethlylene.

8. A method for forming a micro-pattern on a substrate, the method comprising the steps of:
   (a) coating polymer material having a solvent on the substrate, thereby forming a polymer film on the substrate;
   (b) pressing a mold having a predetermined share into the polymer film on the substrate by employing a predetermined compression technique to entail a plastic deformation of the polymer film, thereby patterning the polymer film; and
   (c) performing etching on the substrate through the use of the patterned polymer film as an etching mask, thereby forming a micro-pattern on the substrate,
   wherein before said step (b), the polymer film has been prepared as a film having a porous structure.

9. A method for forming a micro-pattern on a substrate, the method comprising the steps of:

(a) coating polymer material having a solvent on the substrate, thereby forming a polymer film on the substrate;

(b) pressing a mold having a predetermined shape into the polymer film on the substrate by employing a predetermined compression technique to entail a plastic deformation of the polymer film, thereby patterning the polymer film; and (c) performing etching on the substrate through the use of the patterned polymer film as an etching mask, thereby forming a micro-pattern on the substrate, wherein the method before said step (b), further comprises:

(b11) mounting the substrate having the polymer film in a reactor provided with a vessel having a solvent therein; and (b12) heating the vessel at a predetermined temperature range to render the solvent in the vessel to evaporate, thereby making an evaporated solvent penetrate into the polymer film and accordingly leaving the penetrated solvent in the polymer film.

10. A method for forming a micro-pattern on a substrate, the method comprising the steps of:

(a) coating polymer material having a solvent on the substrate, thereby forming a polymer film on the substrate;

(b) pressing a first mold having a first predetermined shape into the polymer film on the substrate to form a first patterned polymer film and then pressing a second mold having a second predetermined shape into the first patterned polymer film by employing a predetermined compression technique, thereby providing a patterned polymer film; and (c) performing etching on the substrate through the use of the patterned polymer film as an etching mask, thereby forming a micro-pattern on the substrate, wherein the method further comprises the step of:

(b1) before said step (b), increasing a free volume in the polymer film so that a pressure applied on the polymer material needed to plastically deform the polymer film is reduced.

11. The method according to claim 10, wherein in said step (c), said etching is either a plasma ion etching or a chemical etching.

12. The method according to claim 10, wherein said step (b1) includes the steps of:

(b11) mounting the substrate having the polymer film in a reactor provided with a vessel having a solvent therein;

(b12) heating the vessel at a predetermined temperature range to render the solvent in the vessel to evaporate, thereby making an evaporated solvent penetrate into the polymer film; and (b13) performing either a vacuum drying or a drying in open ambient on the polymer film, thereby increasing the free volume in the polymer film.

13. The method according to claim 10, wherein in said step (b1), the free volume is increased by performing either a vacuum drying or a drying in open ambient on the polymer film after directly spraying the solvent on the polymer film.

14. The method according to claim 10, wherein said step (b) is performed at a temperature below the glass transition temperature of the polymer material.

15. The method according to claim 14, wherein said step (b) is carried out at a temperature range of about 10 to about 30° C.

16. A method for forming a micro-pattern on a substrate, the method comprising the steps of:

(a) coating polymer material having a solvent on the substrate, thereby forming a polymer film on the substrate;

(b) pressing a first mold having a first predetermined shape into the polymer film on the substrate to form a first patterned polymer film and then pressing a second mold having a second predetermined shape into the first patterned polymer film by employing a predetermined compression technique, thereby providing a patterned polymer film; and (c) performing etching on the substrate through the use of the patterned polymer film as an etching mask, thereby forming a micro-pattern on the substrate, wherein the method before said step (b), further comprises the steps of:

(b11) mounting the substrate having the polymer film in a reactor provided with a vessel having a solvent therein; and (b12) heating the vessel at a predetermined temperature range to render the solvent in the vessel to evaporate, thereby making an evaporated solvent penetrate into the polymer film and accordingly leaving the penetrated solvent in the polymer film.

17. A method for forming a micro-pattern on a substrate, the method comprising the steps of:

(a) coating polymer material having a solvent on the substrate, thereby forming a polymer film on the substrate;

(b) pressing a first mold having a first predetermined shape into the polymer film on the substrate to form a first patterned polymer film and then pressing a second mold having a second predetermined shape into the first patterned polymer film by employing a predetermined compression technique, thereby providing a patterned polymer film; and (c) performing etching on the substrate through the use of the patterned polymer film as an etching mask, thereby forming a micro-pattern on the substrate, wherein before said step (b), the polymer film has been prepared as a film having a porous structure.

18. A method for forming a micro-pattern on a substrate, the method comprising the steps of:

(a) coating polymer material having a solvent on the substrate, thereby forming a polymer film on the substrate;

(b) pressing a first mold having a first predetermined shape into the polymer film on the substrate to form a first patterned polymer film and then pressing a second mold having a second predetermined shape into the first patterned polymer film by employing a predetermined compression technique, thereby providing a patterned polymer film; and (c) performing etching on the substrate through the use of the patterned polymer film as an etching mask, thereby forming a micro-pattern on the substrate, wherein said step (b) is performed at a temperature below the glass transition temperature of the polymer material, wherein the first mold has a higher aspect ratio than the second mold.

19. A method for forming a micro-pattern on a substrate, the method comprising the steps of:

(a) coating polymer material having a solvent on the substrate, thereby forming a polymer film on the substrate;

(b) repeatedly pressing a mold having a predetermined shape into the polymer film on the substrate by employing a step-and-repeat technique to entail a plastic deformation of the polymer film, thereby patterning the polymer film, wherein the length of the substrate is greater than that of the mold; and (c) performing etching on the substrate through the use of the patterned polymer film as an etching mask, thereby forming a micro-pattern on the substrate, wherein the method further comprises the step of:

(b1) before said step (b), increasing a free volume in the polymer film so that a pressure applied on the polymer material needed to plastically deform the polymer film is reduced.

20. The method according to claim 19, wherein said step (b1) includes the steps of:

(b11) mounting the substrate having the polymer film in a reactor provided with a vessel having a solvent therein;

(b12) heating the vessel at a predetermined temperature range to render the solvent in the vessel to evaporate, thereby making an evaporated solvent penetrate into the polymer film; and (b13) performing either a vacuum drying or a drying in open ambient on the polymer film, thereby increasing the free volume in the polymer film.

21. The method according to claim 19, wherein said step (b) is carried out at a temperature range of about 10 to about 30° C.

22. A method for forming a micro-pattern on a substrate, the method comprising the steps of:

(a) coating polymer material having a solvent on the substrate, thereby forming a polymer film on the substrate;

(b) repeatedly pressing a mold having a predetermined shape into the polymer film on the substrate by employing a step-and-repeat technique to entail a plastic deformation of the polymer film, thereby patterning the polymer film, wherein the length of the substrate is greater than that of the mold; and (c) performing etching on the substrate through the use of the patterned polymer film as an etching mask, thereby forming a micro-pattern on the substrate, wherein the method before said step (b), further comprises the steps of:

(b11) mounting the substrate having the polymer film in a reactor provided with a vessel having a solvent therein; and (b12) heating the vessel at a predetermined temperature range to render the solvent in the vessel to evaporate, thereby making an evaporated solvent penetrate into the polymer film and accordingly leaving the penetrated solvent in the polymer film.

* * * * *